(12) United States Patent
Dotan et al.

(10) Patent No.: US 6,521,891 B1
(45) Date of Patent: Feb. 18, 2003

(54) FOCUSING METHOD AND SYSTEM

(75) Inventors: Noam Dotan, Givataim (IL); Asher Pearl, Hod-Hasharon (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/390,542

(22) Filed: Sep. 3, 1999

(51) Int. Cl.$^7$ .................................................. H01J 37/21
(52) U.S. Cl. .................... 250/310; 250/307; 250/396 R; 250/396 MI
(58) Field of Search ................................. 250/310, 307, 250/396 R, 396 ML (56) References Cited

U.S. PATENT DOCUMENTS

| | | | |
|---|---|---|---|
| 4,199,681 A | * 4/1980 | Namae | 250/310 |
| 4,999,496 A | 3/1991 | Shaw et al. | 250/310 |
| 5,032,725 A | * 7/1991 | Kanda | 250/310 |
| 5,591,971 A | * 1/1997 | Shahar et al. | 250/310 |

* cited by examiner

*Primary Examiner*—Jack Berman
(74) *Attorney, Agent, or Firm*—Sughrue Mion, LLP.

(57) ABSTRACT

According to one aspect of the present invention, there is provided a method for controlling of charged particle beam to compensate for a potential being present on a specimen, the method comprising the steps of: moving a charged particle beam over the specimen; measuring at least one secondary product and/or backscattered particles coming from the specimen to produce an image signal; scoring the image signal; changing the beam energy; analyzing the scores achieved with different beam energies; and adjusting the beam energy based on the analysis, to compensate for the potential being present on the specimen.

30 Claims, 8 Drawing Sheets

FOCUSING METHOD AND SYSTEM

FIELD OF THE INVENTION

The invention relates to methods for automatic focusing a charged particle beam. Furthermore, this invention relates to autofocus of a charged particle beam under conditions of charge on the examined specimen.

BACKGROUND OF THE INVENTION

Due to their high resolving power, beams of negatively or positively charged particles are used for the examination of specimen. Compared to optical light, the resolving power of a beam of charged particles is several magnitudes higher and allows for the examination of much finer details. Accordingly, charged particle beams, especially electron beams, are used for the inspection of masks and wafers used in semiconductor technology, which requires a very high resolution.

In order to get a sharp and clear picture of the specimen, it is necessary to focus the charged particle beam on the specimen. Due to the fact that most specimen show some variation in their surface height, the charged particle beam has to be refocused from time to time so that a certain image quality is maintained. The focusing of the charged particle beam is usually done by either varying the current supplied to the objective lens, and thereby changing the focal length, or changing the working distance to the specimen using a Z-stage.

Performing autofocus using changes in the current supplied to the objective lens is somewhat problematic. Due to the high inductance of the magnetic lens coils, the response is very slow and rapid changes in the focal point cannot be made. Furthermore, a variation in the objective lens current causes a change in the magnification and a rotation of the scanning direction of the charged particle beam, changes which are difficult to characterize exactly for each working situation. Accordingly, there is need for an improved method for autofocus of charged particle beam.

A different method to focus an electron beam is described in U.S. Pat. Nos. 4,999,496, 4,999,496 recognizes that changes in focal length or working distance also cause changes in the magnification. In order to compensate for changes in magnification, it teaches to change the beam voltage until a focus is achieved, and use the amount of change to compensate for the changes in magnification.

Apart from surface topography, it has been found that the presence of an electric potential on the surface of the specimen can also lead to a serious degrade in the image quality and focus. The electric potential on the surface of the specimen may be caused by an unintentional or unavoidable charging of the specimen. The electric potential on the surface of the specimen may also be caused by intentionally applying a voltage to the specimen. A voltage can be applied to a wafer, for example, in order to obtain voltage contrast imaging which is used to detect shorts in a circuit. These effects are yet to be countered effectively.

Some specimen, like for example semiconductor wafers, contain a plurality of different target areas that have to be examined. Due to the fact that most specimen are warped and that they usually exhibit some undulations in their surface height, it is often necessary to refocus the charged particle beam on each target area. Unfortunately, this refocusing of the charged particle beam on each target area is a rather time consuming operation. One commonly used way is to focus an optical system on each target area and to learn each target area height. Once each target area height is known, the electron beam can be driven to the right focus on a specific target area if the function of electron beam focus versus the target area height is known. However, apart from being a rather time consuming operation, the process described above leads to additional disadvantages. The transparency of the target area may lead to significant errors in the focusing of the electron beam because the optical system may measure the target area height incorrectly. Furthermore, an electric potential being present in the target area will usually lead to a serious degradation of the image quality. Accordingly, there is also a need for a faster and more reliable method for focusing a beam, especially a charged particle beam, onto a target area.

Prior art methods for focusing a charged particle beam often require a definition of a focus search range for the focus setting and than form corresponding image signals in different focus states of the beam in a way that the focus search range is covered. Focus scores are computed for every image and the scores of all the images are then compared. The value of the parameter corresponding to the image having the highest score is selected for the actual measurement. In many cases, however, the predetermined search range does not include the best focus state and therefore the prior art approach is not capable of finding the best focus state. Furthermore, even if the predetermined search range does include the best focus state, a lot of time is usually wasted, because image signals have to be formed throughout the whole search range. Accordingly, there is also a need for a faster method for focusing a charged particle beam, that does not require a predetermined search range.

SUMMARY OF THE INVENTION

The present invention provides a method for automatic focusing a charged particle beam, which compensates for both surface topography and electric charge on the specimen. According to one embodiment of the invention, "global" focusing is done using a Z-stage, while correction, especially for charge, are made by changing the beam energy. Thus, a fast response is provided for charging effects, while avoiding changes in magnification or scanning direction.

According to one feature of the invention, the negative effects of an electric potential being present on the surface of the specimen are overcome by analyzing scores of images achieved with different beam energies and by adjusting the beam energy according to the analysis. Thereby, image quality problems caused, for example, by a wafer charged with a static charge and showing a surface potential in the range of a couple of hundreds volts, for example +100 to −400 V, can be corrected without any image rotation. Furthermore, there is no necessity to correct stigmation or other beam alignments. Moreover, according to the inventive solution, the magnification remains constant. Accordingly, there is no need to provide a magnification compensation. Compared to an adjustment of the current through the objective lens, the response speed is considerably increased and any hysteresis phenomena, usually connected with a change in the objective lens current, can be avoided. The present invention also provides an apparatus for the examination of specimen that is capable of performing this improved method.

According to a further aspect, the present invention provides a method for mapping a charge distribution on the surface of a specimen. The method uses the information contained in the corrections, that are made by changing the beam energy, in order to compensate for electric charge on the specimen. For each scanned location the beam energy or the changes to the beam energy together with the coordinates of the scanned location are recorded, so that a map showing the charge distribution and/or the field distribution on the surface of the specimen can be constructed. Such a map can be of very high value, for example, when a failure in a circuit design has to be found. The present invention also provides an apparatus for providing a map of the charge distribution on the surface of a specimen.

According to a still further aspect, the present invention provides an improved method for focusing a beam onto a target area of a specimen. The method uses images of a repeating pattern that lies in the path of the beam on its way to the actual target area. Scores of these images that are achieved with different focus settings are analyzed and the correct focus setting is then used once the beam has reached the target area. This method has the advantage that the information about the correct focus is gathered during the time period in which the specimen and/or the beam is moved to the actual target location. Furthermore, this is done through an analysis of the information obtained by the images created by the beam itself. The beam is basically in focus when it reaches the target area. Accordingly, a lot of time, that usually has to be used for collecting all the information about the surface height of each target area, can be saved and the throughput is increased. The present invention also provides an apparatus for the examination of specimen that is capable of performing this improved focusing method.

According to a further aspect, the present invention provides a further improved method for automatic focusing a charged particle beam. The method uses the image scores of two successive focus states and changes the focus state then in a direction that will yield an improvement in the scores. This is repeated until the score has reached a predetermined value or the changes in the scores (or in the focus states) are smaller than a predetermined value that is, for example, smaller or equal to the depth of focus of the beam. The method has the advantage that there is no need to define the focus search range in advance and the method in most cases converges much faster than the methods used in the prior art.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Preliminary, it should be appreciated by those skilled in the art that the present invention can be used with any charged particle device. However, for convenience, then invention will be described with respect to its implementation in an scanning electron microscope (SEM). Those skilled in the art would also appreciate that all discussions herein relating to voltages and potentials refer to relative and not absolute terms. For example, accelerating the beam by connecting the cathode to "ground" and applying 9 kilovolts to the sample is equivalent to applying negative 9 kilovolts to the cathode and placing the specimen at ground. Therefore, while for convenience some discussion is provided in terms of specific voltages, it should be understood that the reference is to relative potential.

Figure 1:
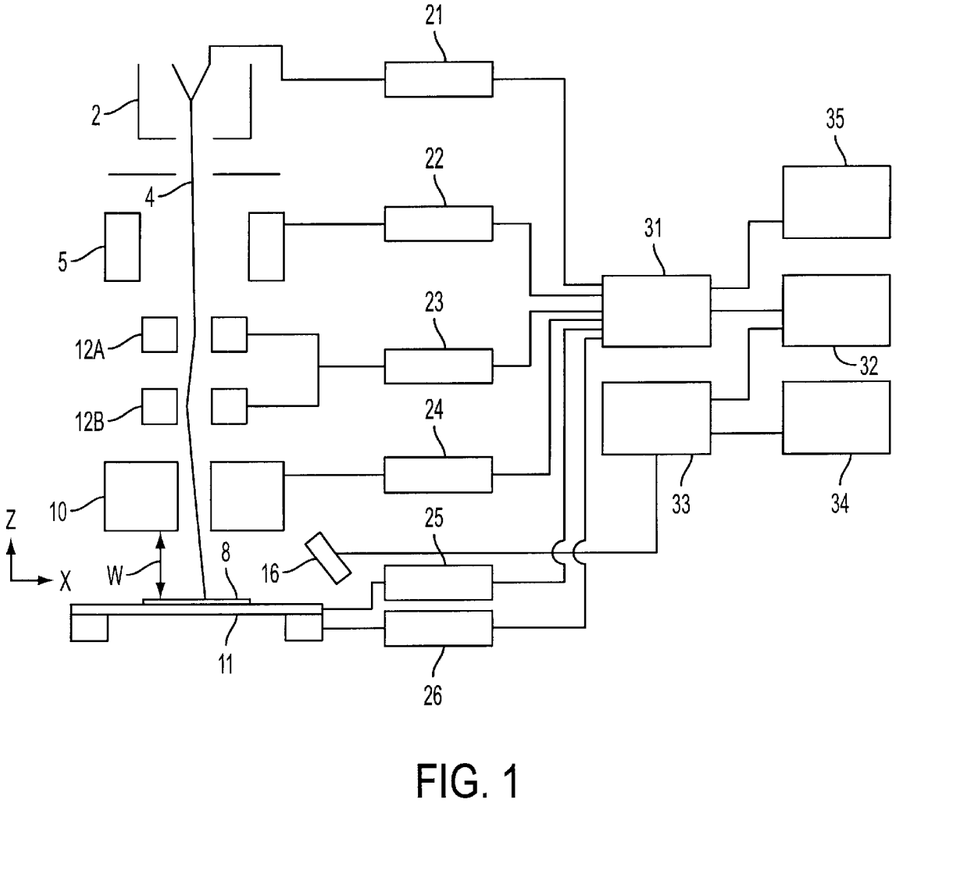
FIG. 1 is a block diagram of an apparatus according to an embodiment of the present invention.

A first embodiment according to the invention is shown schematically in FIG. 1. An electron beam 4 is emitted from the electron source 2 e.g. a tungsten-hairpin gun, a lanthanum-hexaboride gun, or a field-emission gun. In order to accelerate the electrons coming from the electron source, the electron source is supplied by a high voltage supply unit. The electron source 2 is followed by a condenser lens 5, which demagnifies the beam and guides the beam towards a specimen 8. The beam 4 of charged particles then enters the scanning coils 12A and 12B, which are used to move the electron beam 4 over a target area on the specimen 8. The scanning coils 12A and 12B are followed by the objective lens 10 for focusing the particle beam 4 onto a specimen 8, which is located on the specimen support 11. The objective lens can be magnetic or electrostatic. The specimen support 11 is capable of moving the specimen 8 in all directions.

When the electrons strike the surface of the specimen 8, they undergo a series of complex interactions with the nuclei and electrons of the atoms of the specimen. The interactions between the incident electron and the atoms of the specimen may be elastic or inelastic. The interactions produce a variety of secondary products, such as electrons of different energy, X rays, light, and heat, as well as electrons scattered backward. Many of these secondary products and/or the backscattered charged particles are used to produce the image of the specimen and to collect additional data from the specimen 8.

A secondary product of major importance to examination or the image formation of specimens are secondary electrons that escape from the specimen 8 at a variety of angles with relatively low energy (3 to 50 eV). These secondary electrons reach the detector 16 and are detected. By scanning the electron beam 4 over the specimen 8 and displaying/recording the output of the detector 16 an image of the surface of the specimen 8 is formed.

The different parts of the apparatus are connected to corresponding supply units, the high voltage supply unit 21, the condenser lens supply unit 22, the scanning coil supply unit 23, the objective lens supply unit 24, the specimen voltage supply unit 25 and the stage supply unit 26, which are controlled by the parameter adjustment unit 31. The parameter adjustment unit 31 is connected with the standard setting unit 35, which provides a basic set of parameters to the parameter adjustment unit 31. As is known in the art, the objective lens supply unit 24 controls the objective lens according to parameters supplied by the parameter setting unit 35, so that the lens focuses the electron beam on the surface of the specimen 8. The parameters are selected according to an autofocus system (not shown) that is per se known in the art, and focuses the beam according to the topography of the specimen.

However, in case that an electric potential is present on the surface of the specimen, the default values provided by the parameter setting unit 35 will usually result in poor image quality. The specimen may, for example, be unintentionally charged with a static charge and may exhibit a surface potential, for example in the range of +100 to −400V. This problem is exacerbated by the fact that the charge on the sample changes as the sample is scanned for imaging. So while the focus may be adjusted to obtain optimal image of an uncharged sample, as the sample is scanned for imaging it gets increasingly charged and the focus changes and the image is degraded.

The electric potential on the surface of the specimen may also be caused by intentionally applying a voltage to the specimen 8. In order to do that, the parameter adjustment unit 31 generates a signal to the specimen voltage supply unit 25, which applies a corresponding voltage to the specimen support 11 and specimen 8. The voltage applied to the specimen 8 can be used, for example, to filter out those secondary electrons that have less than a certain energy, or to assist secondary electrons escape high aspect features, such as holes and vias.

Figure 2:
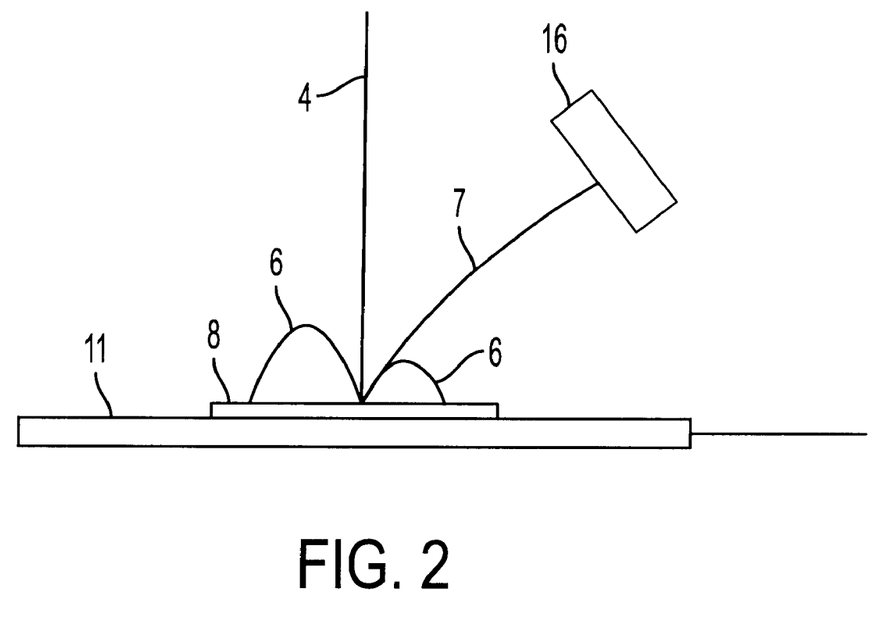
FIG. 2 is an enlarged view of the lower part of the apparatus shown in FIG. 1.

FIG. 2 exemplifies the effects of a positive potential applied to the specimen 8, thereby creating an electrons attractive field. The electron beam 4 hits the specimen 8 and secondary electrons escape from the surface of the specimen 8 at a variety of angles with relatively low energy (3 to 50 eV). Those secondary electron 6 that have less than a predetermined energy, e.g. 20 V, are not capable of escaping the attractive field and reach the detector 16. Consequently, they follow a curved path back to the specimen 8. Only those secondary electrons 7 that have more than the predetermined energy will escape the resulting attractive field and reach the detector 16. Accordingly, the positive voltage applied to the specimen 8 can be used to filter out those secondary electrons that have less than a predetermined energy. On the other hand, by supplying negative potential to the sample, a repelling field is created that assists the electrons escaping the sample. The voltage supplied to the specimen may also be used in order to obtain voltage contrast imaging. Voltage contrast imaging is often used to detect shorts in a circuit produced on a semiconductor wafer.

However, apart from these positive effects, an electric potential present on the surface of the specimen does also effect the electron beam 4. Unfortunately, the effects on the electron beam 4 usually results in a degradation of the image quality. Specifically, when the potential on the specimen 8 changes, the image is distorted as being out of focus.

Therefore, according to an advantageous embodiment of the present invention, the parameters of the objective lens are set according to the surface topography. However, an additional autofocus output is used to vary the beam energy so as to compensate for specimen charge. That is, the objective lens is set to a general focus setting, while the beam energy is controlled to compensate for changes in focus settings due to surface topology or specimen charge. In this manner, "fine" tuning of the focal point of the beam can be rapidly performed since the lens operating parameters remain constant. Additionally, changes in the beam energy, while compensating for focus changes, do not result in image rotation. Moreover, since the change in beam energy is equivalent to the amount of charge on the specimen, no change in magnification occurs, and there is no need to compensate for magnification changes.

In operation the autofocus is first used to determine a basic focus parameter for the objective lens and/or Z-stage. Then the lens parameters are fixed, and any changes dictated by the autofocus system are translated into beam energy changes. One advantageous embodiment utilizing such a beam energy focusing will now be described.

The objective current is set constant to focus the beam at a predetermined working distance. An optical autofocus system (not shown) is used to map the topography of the specimen, or selected targets thereupon. Such optical autofocus systems are well known in the art. For example, one such system is incorporated in the global pre-aligner of the CD-SEM 9000 Si system available from Applied Materials for Santa Clara, Calif. Another optical autofocus which measures the elevation of the sample at a point under the electron beam is disclosed in U.S. Pat. No. 5,311,288. Any of such systems can be used so as to bring the inspected surface to the appropriate working distance that is at the focus point of the objective.

The specimen support 11 (Z-stage) driven by the stage supply unit 26 is used to bring each location/target to the appropriate working distance W from the objective. Thus, when the optical autofocus and Z-stage have zero errors, each location/target on the specimen is brought into focus under the objective. However, as is well known, small errors can always be introduced into the autofocus system and Z-stage. These small errors are corrected using changes in the beam energy. The following is an example of one method for making these small adjustments.

The analyzing unit 32 causes the parameter adjustment unit 31 to transmit a corresponding signal to the scanning coil supply unit 23, so that the electron beam scanned over the specimen or a predetermined portion thereof. The electron beam hits the specimen 8 and secondary electrons coming from the specimen 8 are detected by the detector 16. Accordingly, an image signal is produced and the image signal is transmitted to scoring unit 33, which scores the images in order to determine the quality of the images. The resulting scores are sent to the analyzing unit 32, which after a predetermined time interval, causes the parameter adjustment unit 31 to generate a beam energy changing signal. Based on the beam energy changing signal the voltage supply unit 21 increases the accelerating voltage by a predetermined amount and maintains this new accelerating voltage until a further beam energy changing signal arrives. Furthermore, the analyzing unit 32 causes the parameter adjustment unit 31 to transmit a corresponding signal to the scanning coil supply unit 23, so that electron beam repeats its motion over the specimen.

The detector 16 continues to measure the secondary electrons coming from the surface of the specimen, so that an image signal is produced. The scoring unit 33 continues to score the image signal and sends the scores to the analyzing unit 32. After a further predetermined time interval the analyzing unit 32 causes the parameter adjustment unit 31 again to generate beam energy changing signal. Based on the beam energy changing signal the voltage supply unit 21 decreases the accelerating voltage by a predetermined amount and maintains this new accelerating voltage until a further beam energy changing signal arrives. Furthermore, the analyzing unit 32 causes the parameter adjustment unit 31 again to transmit a corresponding signal to the scanning coil supply unit 23, so that electron beam repeats its motion over the specimen.

By scoring the resulting image signal for the last time interval and sending the results to the analyzing unit 32, the analyzing unit 32 has enough information to compute a value for the beam energy, so that the electric potential being present on the specimen 8 is compensated. The analyzing unit 32 will then cause the parameter adjustment unit 31 to generate beam energy changing signal, so that the correct beam energy will be used for the following measurement. Typically, the accelerating voltage is varied within a few ten volts (±), for example ±60 Volts, of a nominal value, provided by the parameter setting unit 35. Such small changes cause negligible changes in magnification.

As an alternative to the method described above, the analyzing unit 32 may cause the parameter adjustment unit 31 to change the beam energy in predetermined steps and the corresponding images are stored in the scoring unit 33 before the actual scoring is performed. After the scoring unit 33 has scored the stored images, the scores are transferred to the analyzing unit 32. The analyzing unit 32 then has enough information to compute a value for the beam energy, so that the electric potential being present on the specimen 8 is compensated. The analyzing unit 32 will then cause the parameter adjustment unit 31 to generate beam energy changing signal, so that the correct beam energy will be used for the following measurement.

In order to score the images a variety of methods can be used. A preferred method to score the quality of an image is described with reference to FIGS. 3 and 4. Some specimen 8, for example semiconductor wafers, exhibit sharp feature edges on their surface. The preferred scoring method scores the quality of an image based on the sharpness of that part of the image that represents the feature edge. Obviously, the highest scores are given those image that show the feature edge as sharp as possible.

Figure 3:
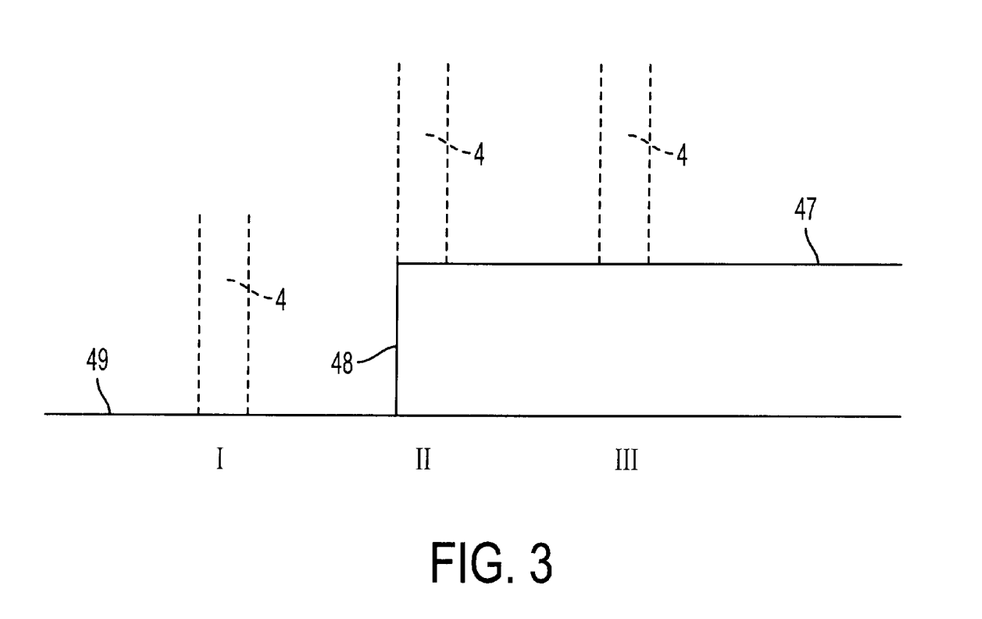
FIG. 3 shows a situation when an electron beam is moved over an edge of an aluminum wiring.

FIG. 3 shows a situation when the electron beam is moved over a single edge 48 of an aluminum wiring 47 present on top of a $SiO_2$-layer 49. Thereby, the electron beam is moved from a position I to a position III via an intermediate position II. At position I, the entire electron beam does not hit the edge 48 of the aluminum wiring 47. Due to fact that secondary electrons can only escape from a small area near the surface of the die, only a few secondary electron are emitted from the surface of the die. At the position II, the electron beam hits the edge 48 of the aluminum wiring 47. Due to vertical surface of the edge 48, the surface area from which secondary electrons are able to escape is enlarged. Accordingly, the number of secondary electrons, that are emitted from the surface of the die, is increased. At position III, the entire electron beam hits the flat surface of the aluminum wiring 47 and the number of secondary electrons is reduced. Due to the fact that different materials exhibit different secondary emission efficiencies, the collected signal at the detector varies according to different materials. Since aluminum has a higher secondary emission efficiency than $SiO_2$, the number of secondary electron at position III is higher than the number of secondary electrons at position I.

Figure 4:
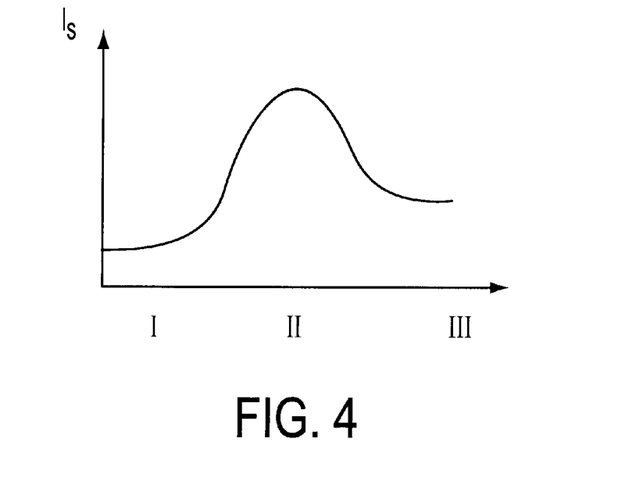
FIG. 4 is a graph illustrating the variation of the current Is representative of the number of secondary electrons while the electron beam is moved from the position I to the position III in FIG. 3.

FIG. 4 is a graph illustrating this variation of the current $I_s$ representative of the number of secondary electrons while moving from the position I to the position III via the intermediate position II. The graph $I_s$ shown in FIG. 4 is intended to describe general aspects of the detected signal like edge enhancement and material contrast. The actual shape of the graph $I_s$, however, depends on a plurality of parameters and may differ from the shape of the graph $I_s$ shown in FIG. 4.

Especially, the precise shape of the graph $I_s$ depends on the spot size of the electron beam and the spot size of the electron beam basically deter mines the image quality. A smaller spot size leads to an image of higher quality, especially to an image of higher resolution. Accordingly, by scoring the sharpness of the graph shown in FIG. 4 the quality of an image can be scored. The sharpness of the graph $I_s$ can be scored, for example, by examining the first derivative of the graph $I_s$ or by using the Fourier transform of the graph $I_s$, which yields the weight of high frequencies corresponding to sharp edges.

By analyzing scores of images achieved with different beam energies and by adjusting the beam energy according to the analysis, image quality problems caused, for example, by a surface potential in a range of a couple of hundreds volts, can be corrected without any image rotation. Furthermore, there is no necessity to correct stigmation or other beam alignments. In many cases magnification remains constant. Accordingly, there is no need to provide a magnification compensation. Compared to an adjustment of the current through the objective lens, the response speed is considerably increased and any hysteresis phenomena, usually connected with a change in objective lens current, can be avoided.

When the focus is finely tuned, imaging can begin. However, there may still be an issue of charge. That is, scanning of the wafer with the charged particle beam may introduce charge, or charge may be present and/or migrate inside the specimen before the scanning. In such a case, a deterioration in the image quality will occur. To correct for such degradation, the process detailed above for fine tuning of the focus is repeated, either automatically or upon manual instruction of the user. That is, images at various beam energy are scored, and the beam energy corresponding to the best image is used for the final imaging.

Also, as noted above, charge may be deliberately introduced in order to cause specific imaging effects, such as voltage contrast imaging or high aspect ratio imaging. In such a case, specimen voltage supply unit is used to apply a potential to the specimen. In order to avoid degradation of the image, a corresponding potential is also added to the beam energy by the high voltage supply unit 21, such that the potential between the tip and the specimen remains constant.

Another advantageous feature of the present invention is providing mapping of charging on a specimen. Specifically, as noted above, in many circumstances the specimen, such as a semiconductor wafer, may be charged beforehand by various unrelated processes. It is very desirable to be able to analyze the distribution of the charging over the surface. Additionally, the ability to map charging on the specimen surface can assist in testing the devices manufactured on the wafer. For example, the application and mapping of charge on the wafer can assist in investigation of the performance of the device and identification of faults such as shorts and disconnects.

In order to provide the charge mapping according to one method of the present invention, the specimen is brought to the appropriate working distance and the voltage suppliers 21 and 24 are set to the standard operation potentials. Then the surface of the specimen is scanned, while the analyzing unit 32 continuously cause the parameter adjustment unit 31 to change the beam energy so that each scanned location is in best focus. The amount of change in the beam energy from the standard operation is then recorded with the corresponding coordinates of the imaged location. From this data, a charge distribution map is constructed. Since the resolution of the SEM is very high, the charge distribution map can be made up to micron accuracy. It should be appreciated that when no auxiliary bias is applied to the sample the SEM is adjusted so that the yield is 1, i.e., the standard beam energy is adjusted so that the number of electron entering and leaving the sample is about the same.

Figure 5:
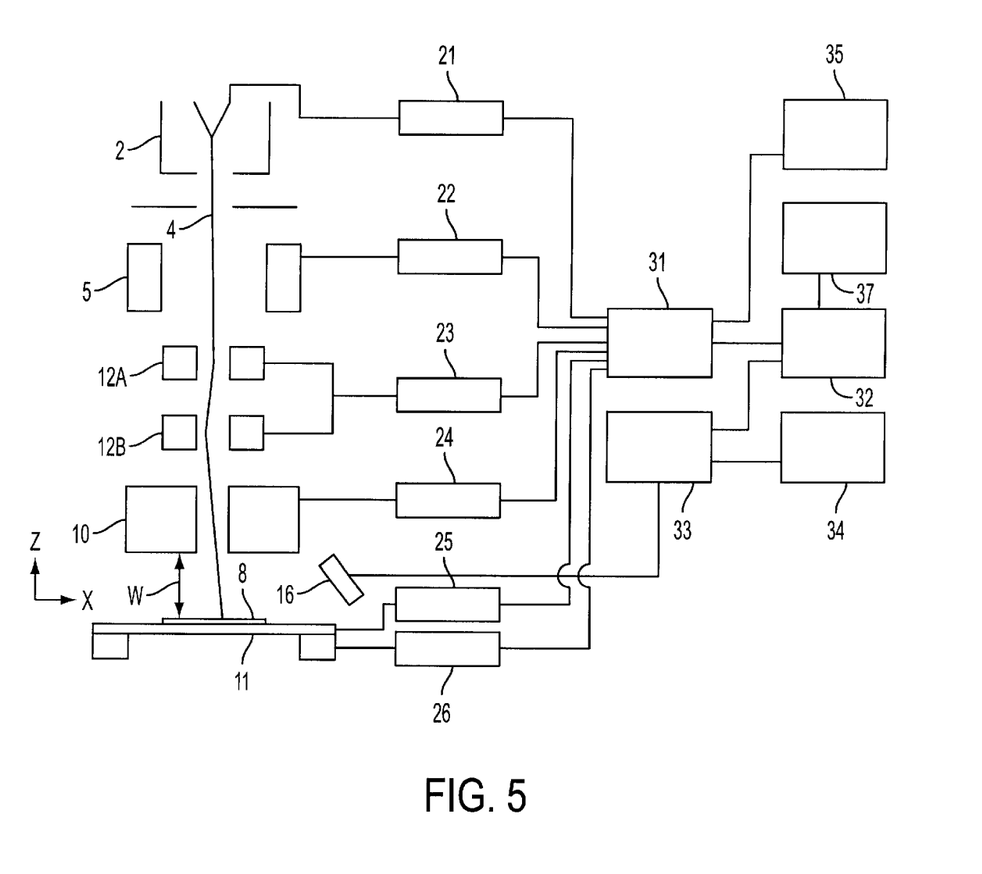
FIG. 5 is a block diagram of an apparatus according to further embodiment of the present invention.

FIG. 5 shows a block diagram of an apparatus corresponding to this aspect of the present invention. This embodiment is similar to that of FIG. 1, except for the following. A recording unit 37 is provided in addition to analyzing unit 32. The recording unit 37 is connected with the analyzing unit 32, in order to store for each scanned location the beam energy or the changes of the beam energy together with the coordinates of the scanned location. The scanned locations may result from a predetermined subdivision of a target area on the specimen or the scanned locations may correspond to features present on the surface of the specimen. By scanning each location the analyzing unit 32 determines the correct beam energy so t hat scanned location is in focus. This information together with the coordinates of the scanned location is then sent to the recording unit 37, so that map of the charge distribution can constructed.

Figure 6:
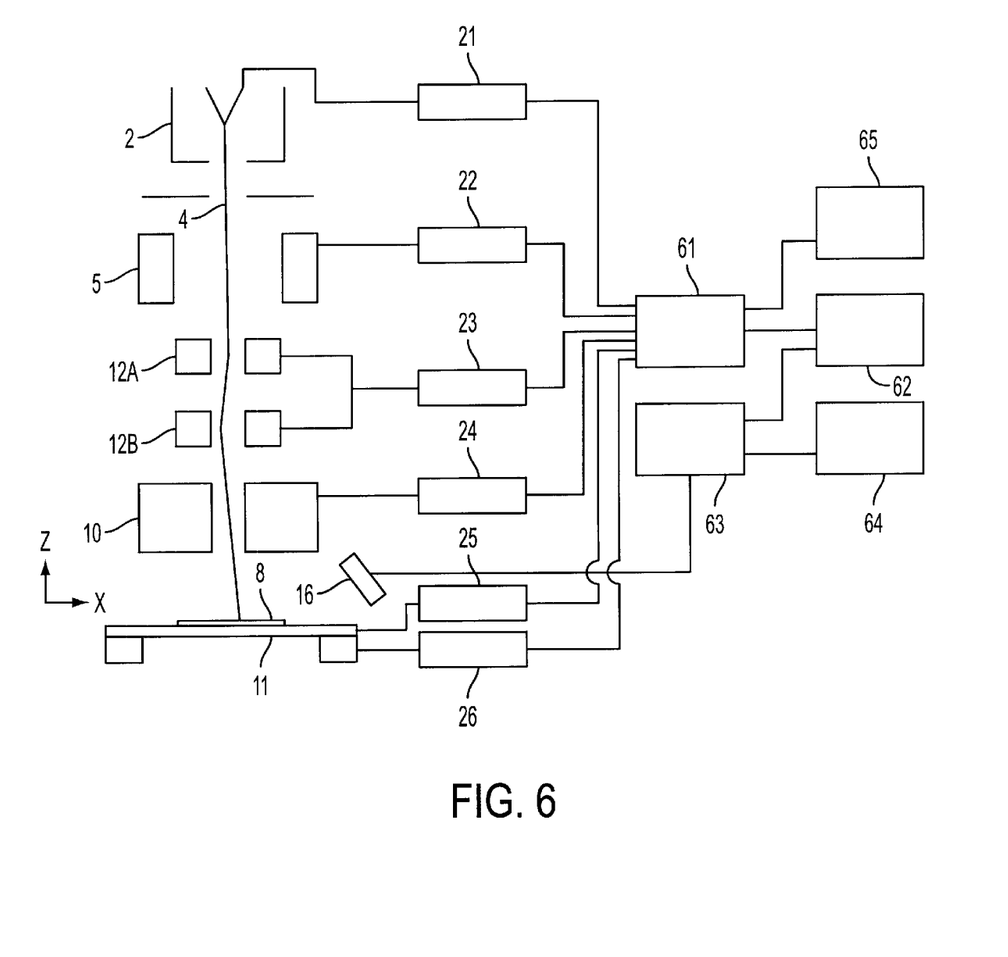
FIG. 6 is a block diagram of an apparatus according to still further embodiment of the present invention.

FIG. 6 shows a block diagram of an apparatus according to a still further aspect of the present invention. This embodiment is also similar to that of FIG. 1, except for the following. The high voltage supply unit 21, the condenser lens supply unit 22, the scanning coil supply unit 23, the objective lens supply unit 24, the specimen voltage supply unit 25, and the stage supply unit 26 are now controlled by the parameter adjustment unit 61. The parameter adjustment unit 61 is connected with the standard setting unit 65, which provides, based on the measurement requirements, a basic set of parameters to the parameter adjustment unit 61. The values of the parameters, like beam energy, condenser lens current and objective lens current, provided by the standard setting unit 65 are used as starting values, which may then be changed in the process of focusing the electron beam on the different target areas of the specimen 8.

Furthermore, the parameter adjustment unit 61 is connected with the analyzing unit 62, so that, based on the analysis performed by the analyzing unit 62, the parameters of the apparatus can be adjusted to get a good performance. The analyzing unit 62 is also connected to the scoring unit 63, which receives the image signal from the detector 16. The scoring unit 63, on the one hand, modifies the image signal, so that the image signal can be displayed on the computer screen 64. On the other hand, the scoring unit 63 examines and scores at least portions of the image signal, so that quality of the image signal can be determined by the analyzing unit 62 based on scores provided by the scoring unit 63.

Figure 7:
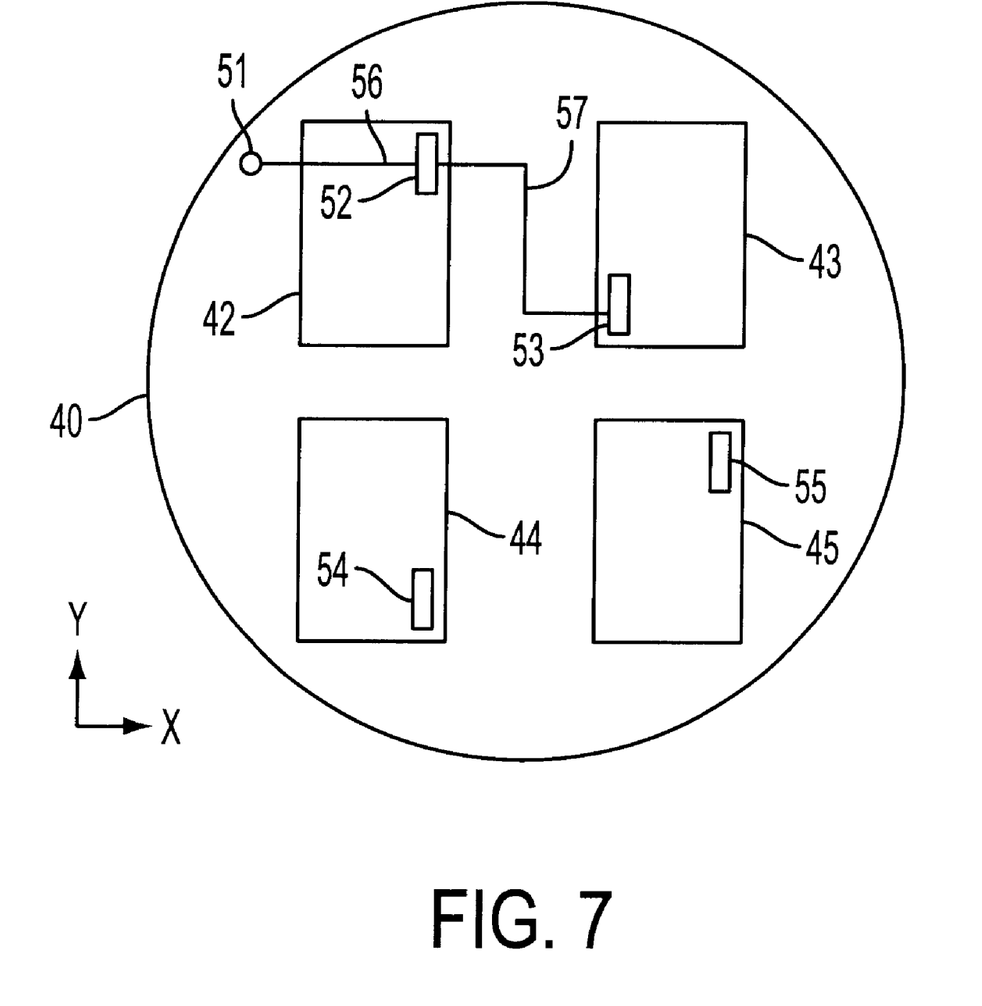
FIG. 7 is a schematic diagram showing a semiconductor wafer having four dies.

FIG. 7 shows a schematic view of a semiconductor wafer 40 carrying only four dies 42, 43, 44, 45. The dies contain the structures, for example a predetermined part of the metallization, that have to be examined in order to control the quality of the process used to prepare the structures. Accordingly, each die contains a target area 52, 53, 54, 55, in which, for example, the dimensions of an aluminum wiring have to be determined. The beam 4 may also be used for a defect review, where the beam 4 (or the stage 11) is the driven from defect to defect which are located randomly over the surface of the wafer.

In order to reach the different target areas, the electron beam is moved from a starting point 51 on the wafer to the first target area 52 along a path 56. After the measurement has been completed in the first target area 52, the electron beam is moved to the second target area 53 and so on until all the measurements are completed. This movement of the electron beam is achieved by keeping the electron beam directed to a fixed spot (spot mode) and moving the wafer relative to the electron beam. The movement of the wafer is caused by a corresponding movement of the stage 11 in X or Y direction. As alternative, the electron beam may also perform a scanning movement with regard to wafer (scanning mode) while the wafer is held in the correct position. A combined movement of the stage 11 and the beam 4 may also be utilized.

In order to find the correct parameter setting for each target area 52, 53, 54, 55, in the prior art an optical distance measurement unit is used to measure the surface height of each target area. This information would then be transferred to the standard setting unit 65 so that a standard setting of parameters can be determined for each target area. This process takes place before the actual measurement begins and adds a considerable time delay to the whole measurement process. In the following it is explained how this time delay can be avoided.

By moving the electron beam over the first die 42 along the path 56, the electron beam already hits features or structures which are present in the area of the die 42 or which are present in the areas surrounding the die 42. Accordingly, feature edges, for example edges of a dielectric layer, edges of a photoresist layer or edges of a metallization, can be used as a repeating pattern in order to score the focusing properties of the electron beam. Preferably, those feature edges are used which extend perpendicular to movement of the electron beam. Feature edges present on a semiconductor wafer have the advantage that all feature edges of a certain type, for example the edges of a metallization, basically have the same dimensions. Accordingly, by moving the electron beam over two spaced apart feature edges of the same kind, basically the same image signal is produced. If the focusing properties of the electron beam are changed while moving from one feature edge to the other feature edge, different image signals are produced. However, due to the fact, that these differences in the image signals are only caused by the changed focusing properties, the correct beam focus can be determined.

Figure 8:
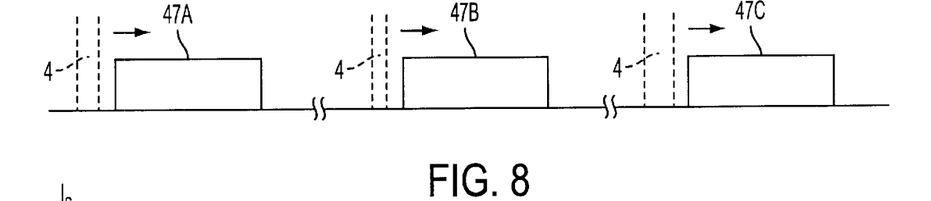
FIG. 8 shows a situation when an electron beam is moved over several edges of an aluminum wiring.
Figure 9:
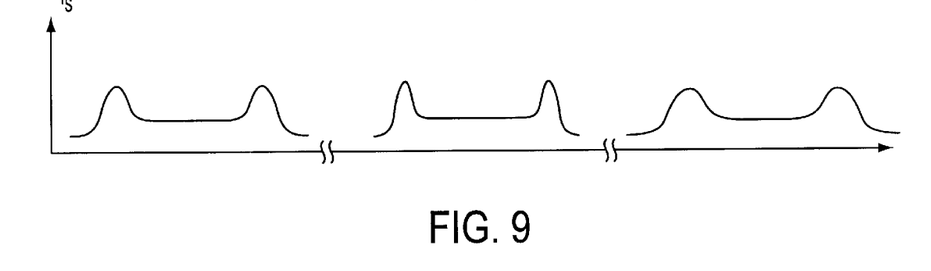
FIG. 9 is a graph illustrating the variation of the current $I_s$ representative of the number of secondary electrons corresponding to the situation shown in FIG. 8.

FIG. 8 shows a situation when the electron beam is moved over several edges of the aluminum wires 47A, 47B, 47C along its path 56. Thereby, the electron beam 4 is moved from the left to the right. As explained with regard to FIG. 3, every time the electron beam 4 moves over an edge the number of secondary electrons increases. FIG. 9 is a graph illustrating this variation of the current Is representative of the number of secondary electrons while moving the electron beam 4 over the aluminum wires 47A, 47B, 47C.

In order to gather the information needed to focus the electron beam 4 while it moves to the first target area 52, the value of at least one parameter affecting the focusing properties of the beam is changed. Preferably, the beam energy is changed in order to affect the focusing properties of the electron beam. However, the objective lens current, the position of the stage 11 in Z direction or the potential of the wafer 8 may also be changed, in order to affect the focusing properties of the electron beam. By changing the focusing properties of the beam the spot size of the electron beam is changed and, therefore, the shape of the graph $I_s$ is changed.

In the situation shown in FIG. 8 the electron beam 4 moves with a predetermined beam energy over the aluminum wire 47A. The resulting current of secondary electrons is shown below in FIG. 9. After the electron beam 4 has been moved over the wire 47A the beam energy (or, e.g., the lens current) is increased. In the situation shown in FIG. 8 an increase in the beam energy or objective lens current leads to a decrease in the spot size of the electron beam 4 hitting the wafer. Accordingly, the electron beam 4 now moves over the wire 47B with a smaller spot size than before. The resulting current of secondary electrons is again shown below in FIG. 9. It can be seen that a smaller spot size of the electron beam 4 leads to a sharper graph $I_s$. After the electron beam 4 has been moved over the wire 47B the beam energy is decreased. Accordingly, the electron beam 4 now moves over the wire 47C with a large spot size and the width of the peaks of the graph $I_s$ is increased.

The change in the beam energy results in a different shape of the graph $I_s$, which, accordingly, leads to a different score for sharpness of graph. By changing the value of the beam energy in the positive as well as in the negative direction in relation to a predetermined default value, the direction of the focusing error can be determined. If a change of the beam energy in the positive direction (higher beam energy) leads to a graph having a higher score than a change of the beam energy in the negative direction (lower beam energy), it means that the value of the beam energy has to be changed in the positive direction, in order to focus the electron beam onto the target area. Furthermore, by analyzing the differences in the scores not only the direction of the error but also the magnitude of the error function can be calculated.

In order to find the parameter (e.g. beam energy, objective lens current, height of stage, etc) for the correct focus, one may also define a focus search range for the parameter and than form corresponding image signals in different focus states of the beam in a way that the focus search range is covered. The scores of all the image signals are then compared and the value of the parameter corresponding to the image signal having the highest score is selected for the actual measurement.

In the following the operation of the apparatus shown in FIG. 6 will be described. Based on the measurement requirements, the standard setting unit 65 provides a basic set of parameters to the parameter adjustment unit 61. Accordingly, the parameter adjustment unit 61 transmits corresponding signals to the high voltage supply unit 21, the condenser lens supply unit 22, and the objective lens supply unit 24, so that a default accelerating voltage, a default condenser lens current and a default objective lens current is used. Furthermore, the parameter adjustment unit 61 transmits corresponding signals to the scanning coil supply unit 23 and the stage supply unit 26, so that the electron beam directed to a fixed spot (spot mode) and the stage 11 moves the wafer from a starting point to a position corresponding to the first target area.

During the movement of the wafer the electron beam 4 hits the wafer and secondary electrons coming from the wafer are detected by the detector 16. Accordingly, an image signal is produced and the image signal is transmitted to scoring unit 63, which scores the portion of the image signal that belong to edges in aluminum wiring as has been described above. The resulting scores are sent to the analyzing unit 62, which after a predetermined time interval, for example 200 $\mu$sec, causes the parameter adjustment unit 61 to generate beam energy changing signal. Based on the beam energy changing signal the voltage supply unit 61 increases the accelerating voltage by a predetermined amount and maintains this new accelerating voltage until a further beam energy changing signal arrives.

The detector 16 continues to measure the secondary electrons coming from the surface of the wafer, so that an image signal is produced. The scoring unit 63 continues to score the portion of the image signal that belong to edges in aluminum wiring sends the scores to the analyzing unit 62. After further 200 $\mu$sec the analyzing unit 62 causes the parameter adjustment unit 61 again to generate beam energy changing signal. Based on the beam energy changing signal the voltage supply unit 21 decreases the accelerating voltage by a predetermined amount and maintains this new accelerating voltage until a further beam energy changing signal arrives.

By scoring the resulting image signal for another 200 $\mu$sec and sending the results to the analyzing unit 62, the analyzing unit 62 usually has enough information to compute a value for the beam energy or for any other parameter affecting the focusing properties of the beam, so that the electron beam is correctly focused onto the first target area 52 when the electron beam reaches the first target area 52. The analyzing unit 62 will then cause the parameter adjustment unit 61 to generate beam energy changing signal (or e.g. an objective lens current changing signal), so that the correct beam energy (or e.g. the correct objective lens current) will be used for the following measurement in the first target area 52. Once the measurement in the first target area 52 is completed, the electron beam is moved to the second target area 53, whereby the described method will be repeated and the first target area 52 will now be used as a starting point. On its way to the second target area 53 the beam 4 may use a path that primarily extends over the second die 43. However, there are applications where one prefers to keep the beam 4 away from the die as long as possible. Accordingly, the beam 4 may also use the path 57 that primarily extends over the area between the dies 42 and 43. This area, usually called scribe line, also contains a large number of structures or features, like test circuits or alignment marks, so that feature edges can again be used as a repeating pattern in order to score the image signal.

Driving the electron beam into focus while the specimen and/or the beam is moved to the new target location has the advantage that the beam is basically in focus when it reaches the target area. Accordingly, the actual measurement can start right away without the need for any additional focusing procedure. Accordingly, the throughput of the system and the productivity of the whole process is increased. Furthermore, this is done through an analysis of the information obtained by the imaging system itself. Accordingly, no additional equipment is needed.

Figure 10:
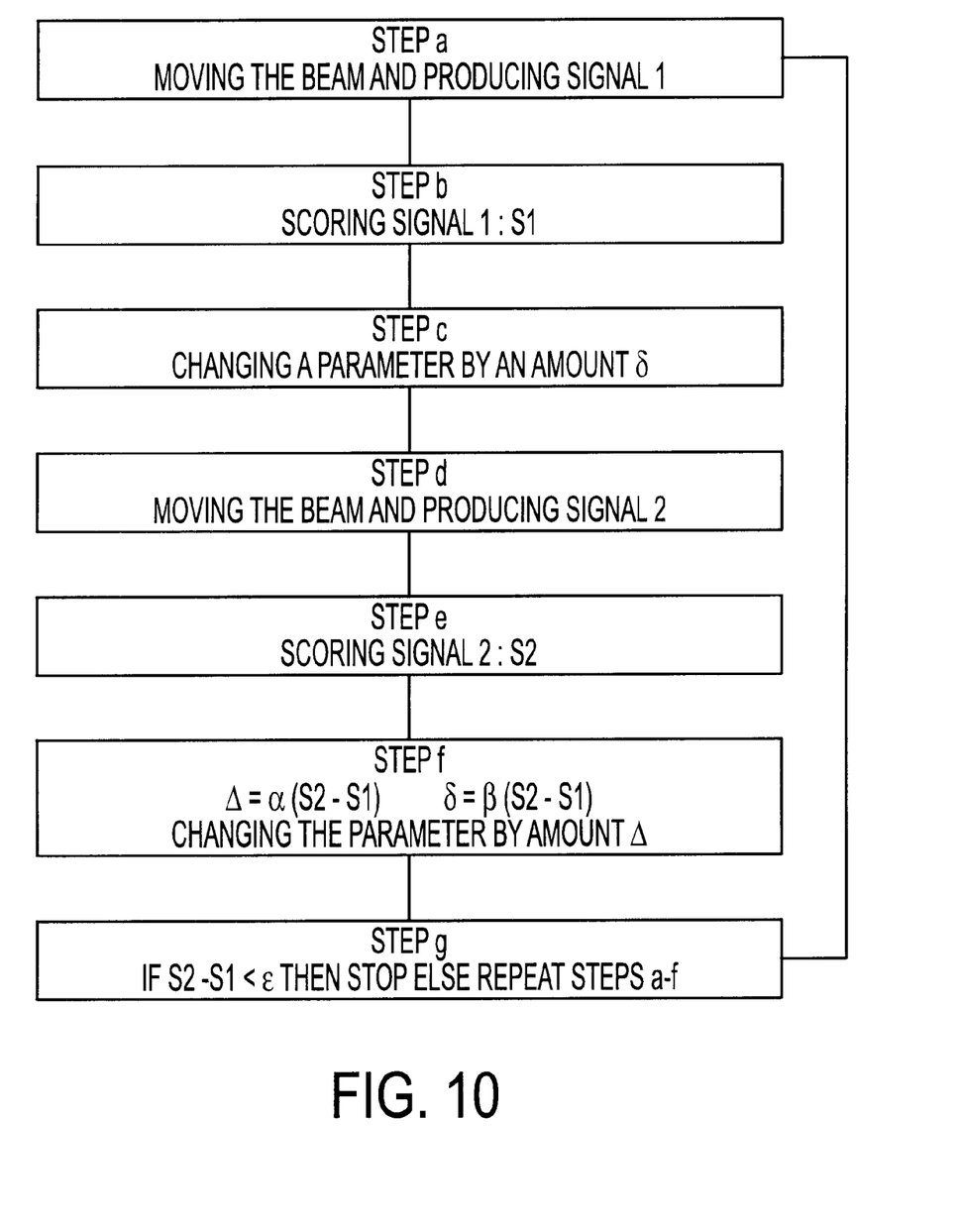
FIG. 10 shows a flow chart of a further improved method for automatic focusing a charged particle beam.

FIG. 10 shows a flow chart of a further improved method for automatic focusing a charged particle beam. This method can be used to focus a charged particle beam while the beam scans over the actual target area. Furthermore, this method can also be used to focus a charged particle beam while the beam is on its way to the actual target area, like in the preceding example.

The method starts with a predetermined parameter setting that is adapted to the specific measurement needs. The charged particle beam is then moved over the specimen and at least one secondary product and/or backscattered particles coming from the specimen are measured to produce a first signal (Step a). The first signal is scored (Step b) and the value of at least one parameter affecting the focusing properties of the beam is changed by a predetermined amount δ (Step c). Suitable parameters include the beam energy, the objective lens current, the height of the specimen support or the voltage supplied to the specimen. With the new value of the parameter the beam is once again moved over the specimen and a second signal is produced (Step d). This signal is also scored (Step e).

In order to adjust the value of the parameter by an amount Δ in the direction of that value of the parameter resulting in the better score, the difference of the two scores is calculated and the amount Δ is chosen to be proportional to this difference (step f). Furthermore, the amount δ by which the value of the parameter is changed in step c is adapted. The amount δ is also chosen to be proportional to the difference of the two scores. In a preferred embodiment these proportionality's are chosen in such a manner that the amount δ is always smaller than the amount Δ.

Steps a, b, c, d, e and f are now repeated (step g) until the difference of the two scores (steps b and e) is less than a predetermined value ε, that is, for example, smaller or equal to the depth of focus of the beam. Once the difference of the two scores is less than depth of focus of the beam, the correct focus setting has been found and the charged particle beam is now focused on the specimen.

In the example shown in FIG. 10, the changes δ and Δ are applied to the same parameter, for example the beam energy. However, one may also apply these changes to different parameters which affect the focusing properties of the charged particle beam. One may, for example, change the beam energy by an amount δ in Step c and change the objective lens current by an amount Δ in Step g. Furthermore, in the example shown in FIG. 10 the change Δ is applied to the chosen parameter before the decision (Step g), whether or not the correct focus has been reached, is made. However, it is clear that the change Δ may also be applied to the parameter after this decision has been made. In case that the new method is used to focus a charged particle beam while the beam is moved to the actual target area the whole process is repeated until the actual target is reached. Thereby, the parameter values that have been determined during one run of the method are used as starting values for the successive run.

The method has the advantage that there is no need to define the focus search range in advance and the method in most cases converges much faster than the methods used in the prior art.

While the invention has been described with reference to four exemplary embodiments thereof, those of ordinary skill in the art would appreciate that various implementations and variations are possible without departing from the scope and spirit of the invention, as defined by the appended claims. For example, it should be readily apparent that the analyzing unit 32 shown in FIG. 1 can be programmed so that it is also capable of performing the task of the analyzing unit 62 shown in FIG. 6. Furthermore, it should be readily apparent that the analyzing unit 32 shown in FIG. 1 and analyzing unit 62 shown in FIG. 6 can be programmed so that they are capable of performing the steps c), f) and g) as shown in FIG. 10. Similarly, the various supply units are provided as examples only, and other combinations or types of supply units may be used. Also, the scoring unit may use one or more of a plurality of different scoring algorithms, and these algorithms can be readily applied to any of the exemplary embodiments disclosed herein. Furthermore, the analyzing unit may also use one or more of a plurality of different analyzing algorithms, and these algorithms can be readily applied to any of the exemplary embodiments disclosed herein.

What is claimed is:

1. A method for automatic focusing a charged particle beam comprising the steps of:
    a) bringing a specimen to an appropriate working distance from an objective having a predetermined focus setting;
    b) moving a charged particle beam over the specimen;
    c) measuring at least one secondary product and/or backscattered particles coming from the specimen to produce a signal;
    d) scoring the signal;
    e) changing the beam energy;
    f) analyzing the scores achieved with different beam energies; and
    g) adjusting the beam energy based on the analysis.

2. The method according to claim 1 wherein the beam energy is changed in predetermined steps and the corresponding image signals are stored before the scoring is performed.

3. The method according to claim 1 wherein the accelerating voltage of the charged particle beam is varied within a few ten volts (±) of a nominal value, in order to compensate for a charge being present on the surface of the specimen.

4. The method according to claim 1 further comprising the step of applying a voltage to the specimen.

5. The method according to claim 4 further comprising the step of varying the beam energy by an amount corresponding to the voltage applied to the specimen.

6. A method for mapping a charge distribution on the surface of a specimen, said method comprising the steps of:
    a) bringing a specimen to an appropriate working distance from an objective having a predetermined focus setting;
    b) moving a charged particle beam over a specimen;
    c) measuring at least one secondary product and/or backscattered particles coming from the specimen to produce a signal;
    d) scoring the signal;
    e) changing the beam energy;
    f) analyzing the scores achieved with different beam energies;
    g) adjusting for each scanned location the beam energy based on the analysis, so that each scanned location is in focus; and
    h) recording for each scanned location the beam energy or the changes of the beam energy together with the coordinates of the scanned location.

7. The method according to claim 6 wherein the beam energies are chosen so that number of electrons entering and leaving the specimen is about the same.

8. A method for focusing a charged particle beam onto a target area, the method comprising the steps of:
    a) providing a specimen having at least one target area and having at least one repeating pattern;
    b) moving the beam from a starting point on the specimen to the target area on the specimen, via the at least one repeating pattern; c) measuring at least one secondary product and/or backscattered portions of the beam coming from the specimen, to produce a signal; d) scoring at least the portions of the signal that represent the pattern; e) changing the value of at least one parameter affecting the focusing properties of the beam; and f) analyzing the scores achieved with different values of the parameter and adjusting the focus of the beam based on the analysis, so that the beam is focused onto the target area.

9. The method according to one of claims 1, 6 or 8 wherein the step of scoring is performed by using the first derivative of the signal or by using the Fourier transform of the signal.

10. The method according to claim 8 wherein steps d) to f) are repeated until the target area is reached, so that the beam is focused onto the target area.

11. The method according to claim 8 wherein steps e) and/or f) comprise changing the beam energy in order to affect the focusing properties of the charged particle beam.

12. The method according to claim 8 wherein steps e) and/or f) comprise changing the objective lens current in order to affect the focusing properties of the charged particle beam.

13. The method according to claim 8 wherein steps e) and/or f) comprise changing the height of a specimen support in order to affect the focusing properties of the beam.

14. The method according to claim 8 wherein steps e) and/or f) comprise changing the voltage supplied to the specimen in order to affect the focusing properties of the beam.

15. The method according to claim 8 wherein step e) comprises changing the value of at least one parameter affecting the focusing properties of the beam in the positive as well as in the negative direction.

16. The method according to claim 8 wherein step e) comprises changing the value of at least one parameter affecting the focusing properties of the beam in predetermined steps and the corresponding image signals are stored before the scoring is performed.

17. A method for automatic focusing a charged particle beam comprising the steps of:
   a) moving a charged particle beam over a specimen and measuring at least one secondary product and/or backscattered particles coming from the specimen to produce a signal
   b) scoring the signal;
   c) changing the values of at least one parameter affecting the focusing properties of the beam by an amount δ;
   d) moving a charged particle beam over a specimen and measuring at least one secondary product and/or backscattered particles coming from the specimen to produce a signal;
   e) scoring the signal;
   f) using the scores achieved with the last two values of said one parameter to:
      adjust the value of said parameter or the value of another parameter affecting the focusing properties of the beam by an amount Δ, and
      adapt the amount δ by which the value of said one parameter is changed;
   g) repeating steps a), b), c), d), e) and f) until a predetermined score is reached, the difference of the scores and/or the amount Δ of the adjustment is less than a predetermined value.

18. The method according to claim 17 wherein the amount Δ of adjustment in step f) depends on the difference of the scores achieved with the last two values of the parameter.

19. The method according to claim 17 wherein the amount δ of the change of the parameter value in step c) depends on the difference of the scores achieved with the last two values of the parameter.

20. The method according to claim 17 wherein the amount δ of the change of the parameter value in step c) is proportional to amount Δ of adjustment of the parameter value in step f).

21. The method according to claim 20 wherein the proportionality constant is smaller than 1.

22. The method according to claim 17 wherein the step of scoring is performed by using the first derivative of the signal or by using the Fourier transform of the signal.

23. The method according to claim 17 wherein steps c) and/or f) comprise changing the beam energy in order to affect the focusing properties of the charged particle beam.

24. The method according to claim 17 wherein steps c) and/or f) comprise changing the objective lens current in order to affect the focusing properties of the charged particle beam.

25. The method according to claim 17 wherein steps c) and/or f) comprise changing the height of a specimen support in order to affect the focusing properties of the beam.

26. The method according to claim 17 wherein steps c) and/or f) comprise changing the voltage supplied to the specimen in order to affect the focusing properties of the beam.

27. A charged particle apparatus for the examination of specimen comprising:
   a) a particle source for providing a beam of charged particles;
   b) an objective for focusing the charged particle beam onto a focal point;
   c) a specimen support for bringing the specimen to an appropriate working distance from the objective;
   d) a detector for measuring at least one secondary product and/or backscattered particles coming from the specimen;
   e) a scanning unit for scanning the charged particle beam over an target area on the specimen, so that a signal is generated;
   f) a scoring unit for scoring the signal;
   g) an analyzing unit for analyzing different scores; and
   h) a parameter adjustment unit for generating beam energy changing signal thereby changing the focal point.

28. The apparatus according to claim 27 wherein the parameter adjustment unit generates accelerating voltage changing signal in order to change the beam energy.

29. An apparatus for providing a map of the charge distribution on the surface of a specimen comprising:
   a) a particle source for providing a beam of charged particles;
   b) an objective for focusing the charged particle beam onto a focal point;
   c) a specimen support for bringing the specimen to an appropriate working distance from the objective;
   d) a detector for measuring at least one secondary product and/or backscattered particles coming from the specimen;
   e) a scanning unit for scanning the charged particle beam over an target area on the specimen, so that a signal is generated;
   f) a scoring unit for scoring the signal;
   g) an analyzing unit for analyzing different scores; and
   h) a parameter adjustment unit for generating beam energy changing signal for each scanned location, so that each scanned location is in focus;

i) a recording unit for recording for each scanned location the beam energy or the changes of the beam energy together with the coordinates of the scanned location.

30. An apparatus for the examination of the specimen comprising:
   a) a beam source for providing a beam for the examination of specimen;
   b) at least one lens for focusing the beam onto the specimen;
   c) a detector for measuring at least one secondary product and/or backscattered portions of the beam coming from the specimen;
   d) a specimen support for supporting the specimen and for moving the specimen relative to the beam, so that an image signal is generated;
   e) a scoring unit for scoring at least portions of the image signal;
   f) an analyzing unit for analyzing different scores; and
   g) a parameter adjustment unit for generating at least one parameter changing signal to affect the focusing properties of the beam and for generating a focus compensation signal based on the analysis of the scores to compensate for charge on the specimen.

* * * * *